United States Patent
Jahan et al.

(10) Patent No.: US 11,280,877 B2
(45) Date of Patent: Mar. 22, 2022

(54) METHOD FOR TESTING THE ELECTROMAGNETIC COMPATIBILITY OF A RADAR DETECTOR WITH AT LEAST ONE ONBOARD PULSE SIGNAL TRANSMITTER

(71) Applicant: THALES, Courbevoie (FR)

(72) Inventors: Daniel Jahan, Brest (FR); Jean-Michel Quellec, Brest (FR); Jean-Paul Artis, Brest (FR); Daniel Christien, Brest (FR)

(73) Assignee: THALES, Courbevoie (FR)

( * ) Notice: Subject to any disclaimer, the term of this patent is extended or adjusted under 35 U.S.C. 154(b) by 341 days.

(21) Appl. No.: 16/348,836

(22) PCT Filed: Nov. 10, 2017

(86) PCT No.: PCT/EP2017/078901
§ 371 (c)(1),
(2) Date: May 9, 2019

(87) PCT Pub. No.: WO2018/087299
PCT Pub. Date: May 17, 2018

(65) Prior Publication Data
US 2019/0277945 A1   Sep. 12, 2019

(30) Foreign Application Priority Data
Nov. 10, 2016 (FR) ...................................... 16 01604

(51) Int. Cl.
*G01S 7/02* (2006.01)
*G01S 7/292* (2006.01)
*G01R 31/00* (2006.01)

(52) U.S. Cl.
CPC .............. *G01S 7/021* (2013.01); *G01S 7/023* (2013.01); *G01S 7/292* (2013.01); *G01R 31/001* (2013.01)

(58) Field of Classification Search
CPC ........ G01S 7/023; G01S 7/021; G01S 7/4021; G01S 7/292; G01S 7/282; G01S 7/038
See application file for complete search history.

(56) References Cited

U.S. PATENT DOCUMENTS 6,727,840 B1   4/2004 Sullivan
2010/0135443 A1   6/2010 Lackey
(Continued)

FOREIGN PATENT DOCUMENTS

JP   2010-19678 A   1/2010

OTHER PUBLICATIONS

International Search Report, Issued by International Searching Authority in corresponding International Application No. PCT/EP2017/078901, dated Feb. 13, 2018.
(Continued)

*Primary Examiner* — Olumide Ajibade Akonai
(74) *Attorney, Agent, or Firm* — Arent Fox LLP

(57) ABSTRACT

The invention relates to a method for testing the electromagnetic compatibility of a radar detector with at least one onboard pulse signal transmitter, wherein said radar detector and each onboard transmitter are part of the same platform, by means of eliminating the external echo component in the signals received by the radar detector, said method comprising a training phase allowing the detected pulses to be divided into classes, grouping together the pulses for which at least two characteristics have a common range of values, and a phase of eliminating the pulses that belong to the selected classes.

10 Claims, 11 Drawing Sheets

(56) References Cited

U.S. PATENT DOCUMENTS

| | | | |
|---|---|---|---|
| 2013/0214963 A1* | 8/2013 | Vacanti | G01S 7/038 |
| | | | 342/120 |
| 2015/0084808 A1* | 3/2015 | Vacanti | G01S 13/02 |
| | | | 342/122 |

OTHER PUBLICATIONS

Stéphane Kemkemian et al., "Toward Common Radar & EW Multifuncton Active Arrays" Phased Array Systems and Technology (Array), 2010 IEEE International Symposium On, IEEE, XP31828584, pp. 777-784, (2010).

* cited by examiner

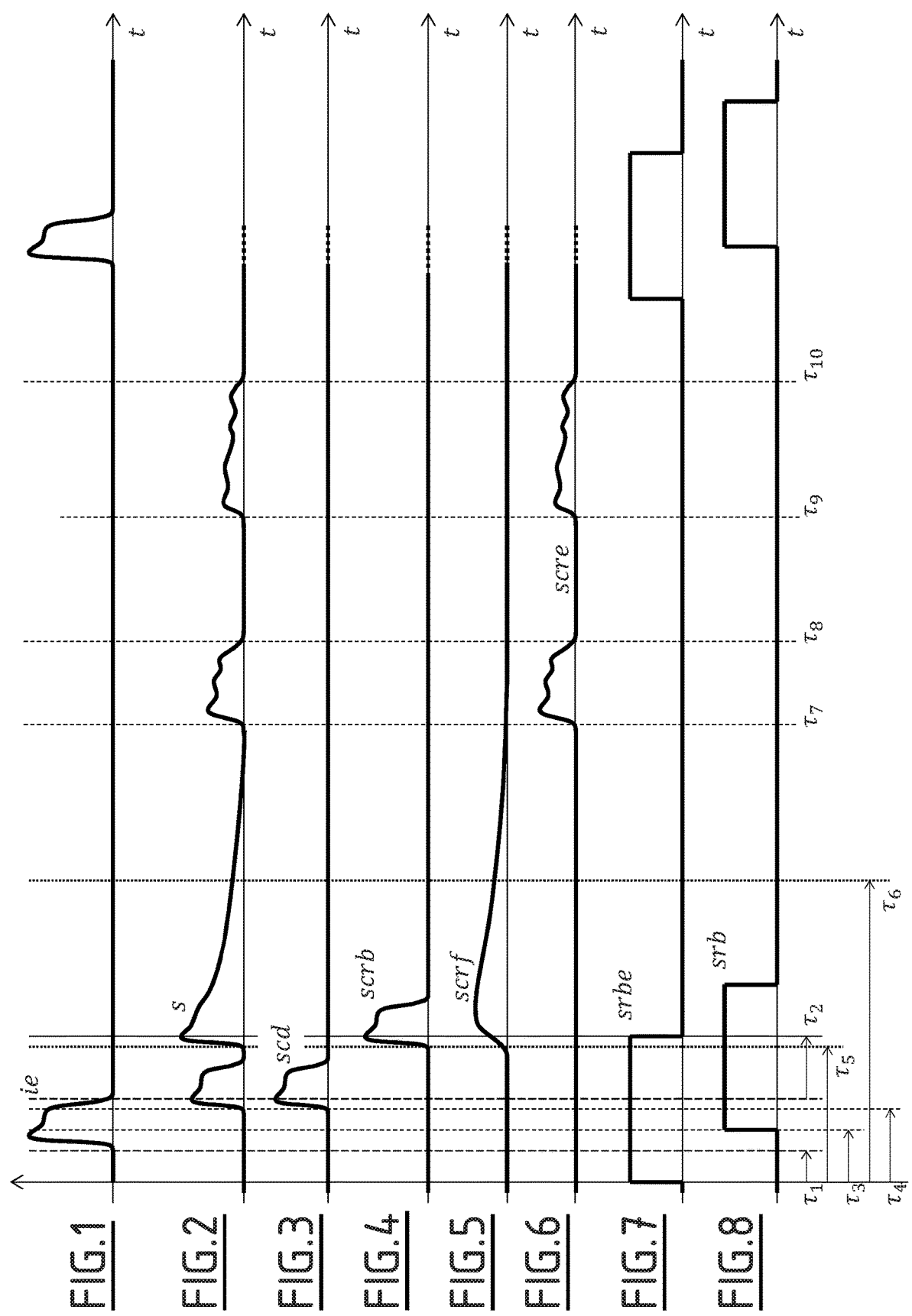

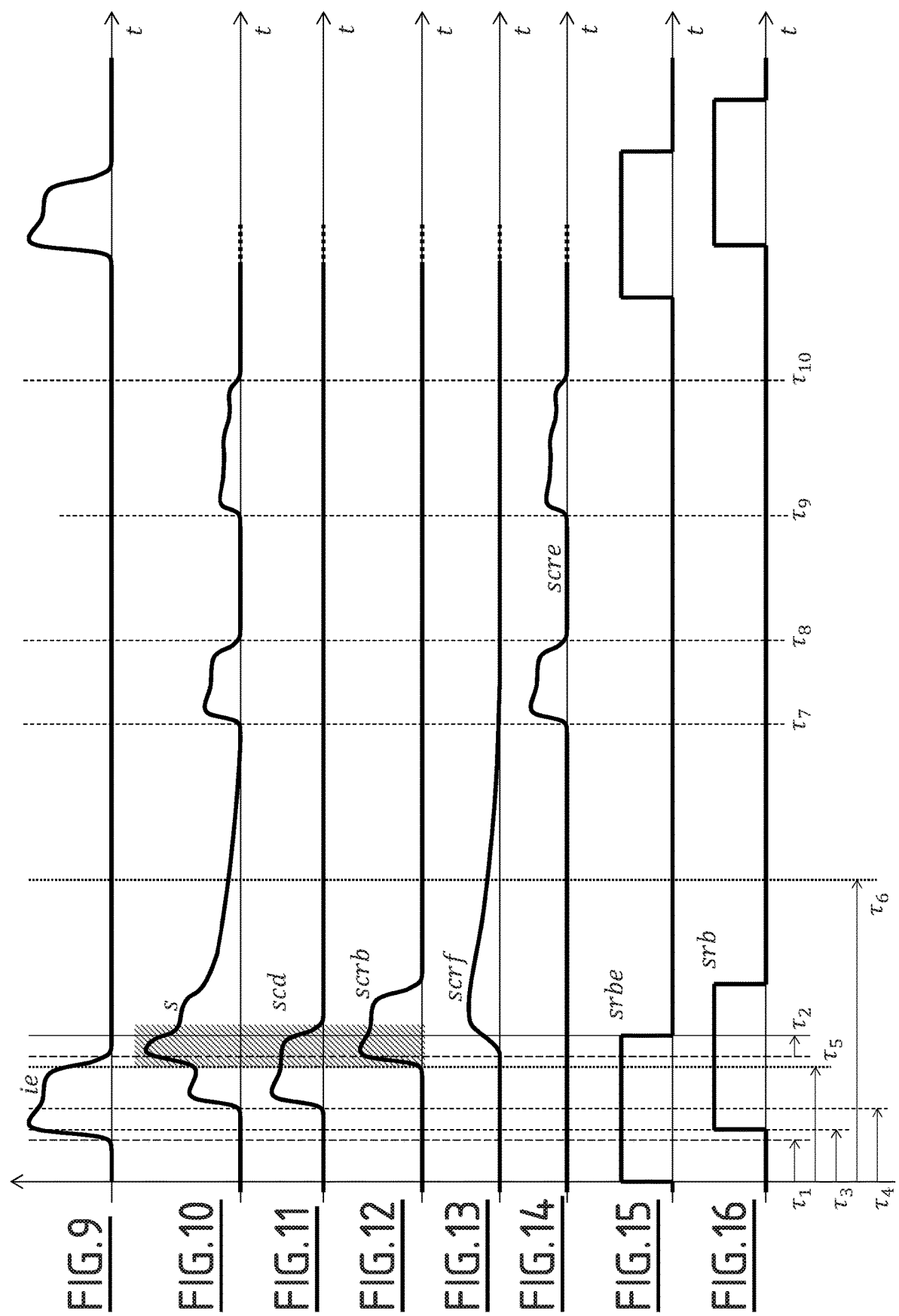

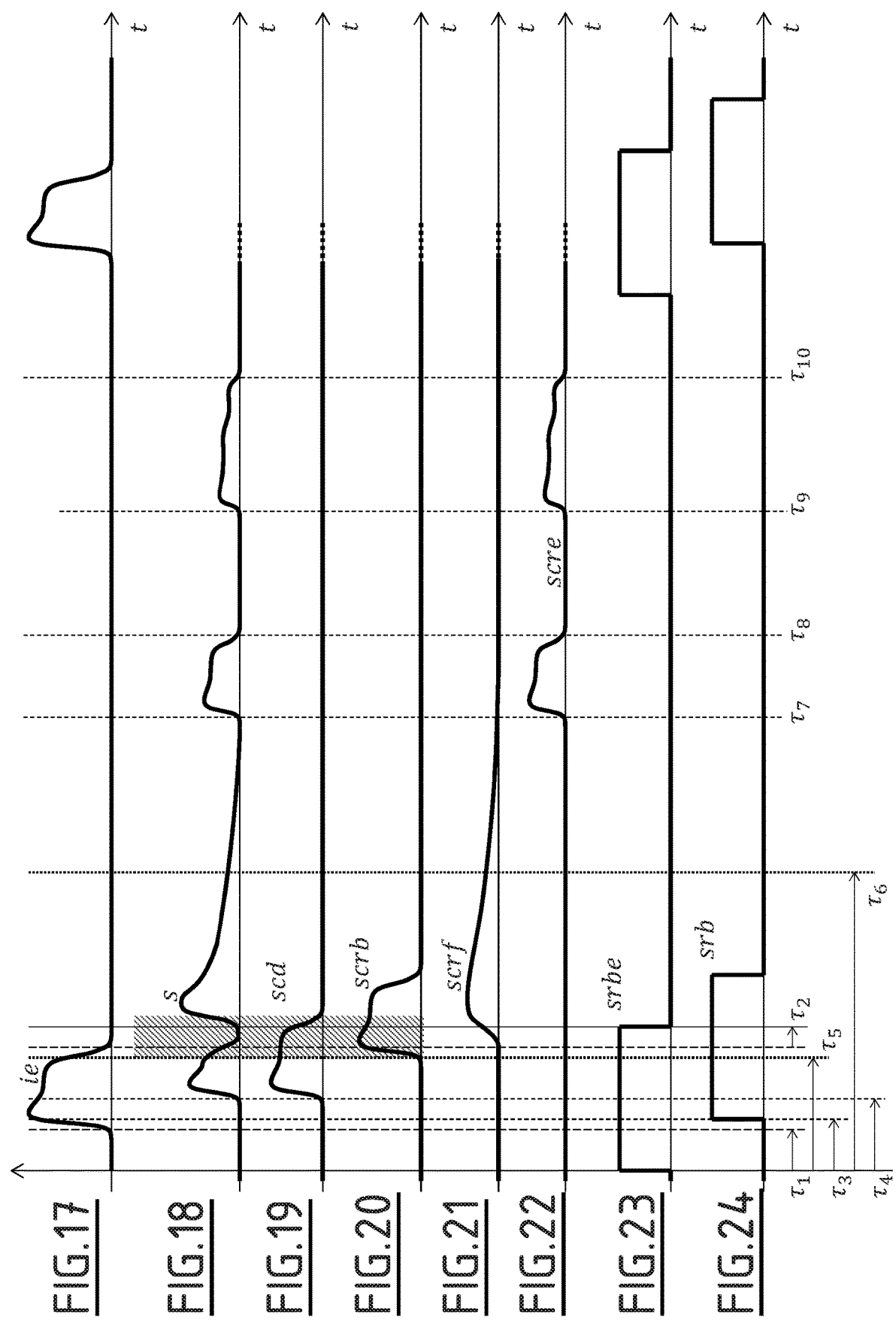

METHOD FOR TESTING THE ELECTROMAGNETIC COMPATIBILITY OF A RADAR DETECTOR WITH AT LEAST ONE ONBOARD PULSE SIGNAL TRANSMITTER

CROSS-REFERENCE TO RELATED APPLICATIONS

This application is a National Stage Entry of International Patent Application No. PCT/EP2017/078901, filed on Nov. 10, 2017, which claims priority to French Patent Application No. 16 01604, filed on Nov. 10, 2016. The disclosures of the priority applications are incorporated in their entirety herein by reference.

The invention relates to a method for testing the electromagnetic compatibility of a radar detector with at least one onboard pulse signal transmitter. The invention also relates to an associated radar detector and platform.

A platform is a hardware entity in particular used in the military field. A ship, an aircraft, a land-based vehicle, a land-based ground station or a space station are examples of such platforms.

The platforms are equipped with radar detectors and onboard radars. Radar detectors serve to receive and detect radar signals, while on board radars emit radar signals.

In some situations, the radar detector receives pulses coming from onboard radars.

Indeed, studying the pulse received by a radar detector coming from an onboard radar shows that the received pulse comprises a direct component and reflected components.

The direct component is due to the propagation of the pulse emitted between the antenna of the radar and that of the radar detector, along the shortest path. The direct component therefore arrives at the radar detector delayed relative to the emitted pulse, but first relative to the others that are reflected.

The reflected components are due to the reflections of the emitted pulse on all of the other hardware objects reflecting the environment. Different types of reflective objects can be distinguished based on their proximity to players (antenna of the onboard radar and antenna of the radar detector). In order of increasing distance, the first type corresponds to the reflective surfaces of the carrier platform in view of the players (for example for a ship, the superstructures, a cannon), the second type corresponds to the land surface (essentially the sea, or even the ground to a certain extent) that plays continuously up to the radio horizon, and the third type corresponds to the particularly reflective surfaces of finite size bounded in the propagation direction, thus forming singular points (platforms other than the carrier platform, land relief).

Thus, the presence of the onboard radars therefore hinders the operation of the radar detector, whether via the direct component or the reflected components of first, second or third type.

It is therefore desirable for the operation of the radar detectors to be compatible with the onboard radars. Such an issue is typically called electromagnetic compatibility (abbreviated EMC).

To that end, it is known to use an effective attenuation in the entire reception frequency band of the radar detector. Such an attenuation is for example done using a PIN (Positive Intrinsic Negative) diode then serving as switch.

However, such an attenuation involves cutting all reception during the bother phases, which decreases the issue of interception of the radar detector on the radar signals of interest.

There is therefore a need, in the context of a platform equipped with a radar detector and at least one onboard pulse signal transmitter, for a method for testing the electromagnetic compatibility between the radar detector and each onboard transmitter that is more effective.

To that end, the description describes a method for testing the electromagnetic compatibility of a radar detector with at least one onboard pulse signal transmitter, the radar detector and each onboard transmitter belonging to the same platform, by eliminating the external echo component in the signals received by the radar detector, the method comprising a training phase including, for each onboard transmitter, an acquisition subphase seeking to obtain detected pulses, each pulse being characterized by characteristics, the characteristics including at least the date of arrival of the pulse in question and the carrier frequency of the pulse in question. The method comprises a subphase including acquiring signals derived from pulses emitted by the onboard transmitter in question and each corresponding to the external echo component, in order to obtain the detected pulses, and acquiring measurements of characteristics of the detected pulses, a calculating subphase including distributing the detected pulses into classes grouping together the pulses for which at least two characteristics have a shared value range, and selecting classes including a number of pulses greater than or equal to a predetermined threshold, in order to obtain selected classes, and an elimination phase including building an elimination range, an elimination range being the set of pulses detectable by the radar detector belonging to the selected classes, and the elimination in the signals received by the radar detector (4) of the pulses belonging to the elimination range.

According to specific embodiments, the method comprises one or more of the following features, considered alone or according to any technically possible combinations:

- during each calculation subphase, the number of characteristics is less than 5.
- the characteristics include the pulse width and the direction of arrival.
- each calculating subphase includes a grouping of classes by using a distance criterion between two classes.
- the radar detector includes an attenuator, the elimination is implemented by using the attenuator preventing the detection of pulses belonging to the elimination range.
- the radar detector includes a computer, the elimination being implemented by the computer by eliminating detected pulses belonging to the elimination range.
- each onboard transmitter is capable of producing a synchronization signal, the training and elimination phases being paced using the synchronization signal of each onboard transmitter.
- the acquisition subphase includes the formation and use of acquisition ranges.
- the calculating subphase is carried out twice, the distribution during the first implementation of the calculating subphase using first characteristics, the distribution during the second implementation of the calculating subphase using second characteristics, the first and second characteristics being different and the classes selected for the eliminating phase being the classes selected during the first implementation of the calculating subphase and the classes selected during the second implementation of the calculating subphase.

The description also proposes a radar detector comprising an electromagnetic wave receiver and a calculator, the radar detector being configured to implement a method for testing the electromagnetic compatibility of a radar detector with at least one onboard pulse signal transmitter, the radar detector and each onboard transmitter belonging to the same platform, by eliminating the external echo component in the signals received by the radar detector, the method comprising a training phase including, for each onboard transmitter, an acquisition subphase seeking to obtain detected pulses, each pulse being characterized by characteristics, the characteristics including at least the date of arrival of the pulse in question and the carrier frequency of the pulse in question, the subphase including the acquisition of signals derived from pulses emitted by the onboard transmitter in question and each corresponding to the external echo component in order to obtain the detected pulses, and the acquisition of measurements of characteristics of the detected pulses. The method comprises a calculating subphase including distributing the detected pulses into classes grouping together the pulses for which at least two characteristics have a shared value range, and selecting classes including a number of pulses greater than or equal to a predetermined threshold, in order to obtain selected classes, and an elimination phase including building an elimination range, an elimination range being the set of pulses detectable by the radar detector belonging to the selected classes, and the elimination in the signals received by the radar detector of the pulses belonging to the elimination range.

The description also relates to a platform equipped with a radar detector as previously described.

Other features and advantages of the invention will appear upon reading the following description of embodiments of the invention, provided as an example only and in reference to the drawings, which are:

FIGS. 1 to 8, schematic illustrations of signals for a first case;

FIGS. 9 to 16, schematic illustrations of signals for a second case;

FIGS. 17 to 24, schematic illustrations of signals for a third case;

FIG. 25, a schematic illustration of an example radar detector capable of implementing a method for testing the electromagnetic compatibility between pulse signal receivers and onboard pulse signal transmitters, and FIGS. 26 to 32, schematic functional illustrations of an example embodiment of the test method at several different stages.

Proposed is a platform including a plurality of onboard pulse signal transmitters 2 and at least one radar detector 4.

Before outlining the components of the radar detector 4, the disruptive environment is described in which the radar detector 4 is called upon to work in reference to FIGS. 1 to 24.

FIG. 1 shows the envelope of the emitted pulses designated by ie; these pulses are recurrent.

FIGS. 3 to 6 show the envelopes of four physical components forming the received signal s.

FIG. 3 shows the envelope of the direct component, the direct component being designated by scd.

FIG. 4 shows the envelope of the component reflected by elements of the carrier platform. Such a component is called onboard reflected component. The onboard reflected component is designated by the reference sign scrb.

FIG. 5 shows the envelope of the component reflected by the land surface. Such a component is called the clutter. The clutter is designated by reference sign scrf.

FIG. 6 shows the envelope of the component reflected on outside isolated objects. Due to the similarity with the echoes in radar, the reflected component on external isolated objects is designated by reference sign scre.

In FIG. 6, as an example, only two echoes are illustrated.

FIG. 7 shows a synchronization signal of an onboard radar delivered by itself. The synchronization signal is designated by reference sign srbe.

In the illustrated example, the synchronization signal srbe temporally overlaps the emitted pulse ie. As a result, a first time interval $\tau_1$ and a second time interval $\tau_2$ can be defined.

The front edge of the synchronization signal srbe is in advance by a first time interval $\tau_1$ relative to the moment of the beginning of the emitted pulse ie.

The back edge of the synchronization signal srbe is behind by a second time interval $\tau_2$ relative to the moment of the end of the emitted pulse ie.

FIG. 8 shows a signal corresponding to the synchronization signal srbe that arrives at the radar detector 4 after propagating in a transmission cable. The arriving signal is designated by reference sign srb.

The transmitted signal srb is delayed by a third time interval $\tau_3$ relative to the synchronization signal srbe.

The fourth time interval $\tau_4$ is defined as the time delay between the beginning of the received signals and the front edge of the synchronization signal srb.

It should be noted that the difference between the fourth and third time intervals $\tau_4 - \tau_3$ corresponds to the warning that the front edge of the transmitted signal srb offers relative to the actual bother; this warning should therefore be large enough and positive so that it can be used (typically at least several hundreds of nanoseconds).

A fifth time interval $\tau_s$ is defined as the time interval between the front edge of the synchronization signal srbe and the latest date of arrival of the pulses reflected by the edge of type scrb.

A sixth time interval $\tau_6$ corresponds to the time interval between the front edge of the synchronization signal srbe and the passage of the clutter scrf under a nondisruptive power.

A seventh time interval $\tau_7$ and an eighth time interval $\tau_8$ are also defined respectively corresponding to the start and end moments of the first echo relative to the front edge of the synchronization signal srbe. The ninth and tenth time intervals $\tau_9$ and $\tau_{10}$ correspond to the same moments for the second echo.

Figure 2:
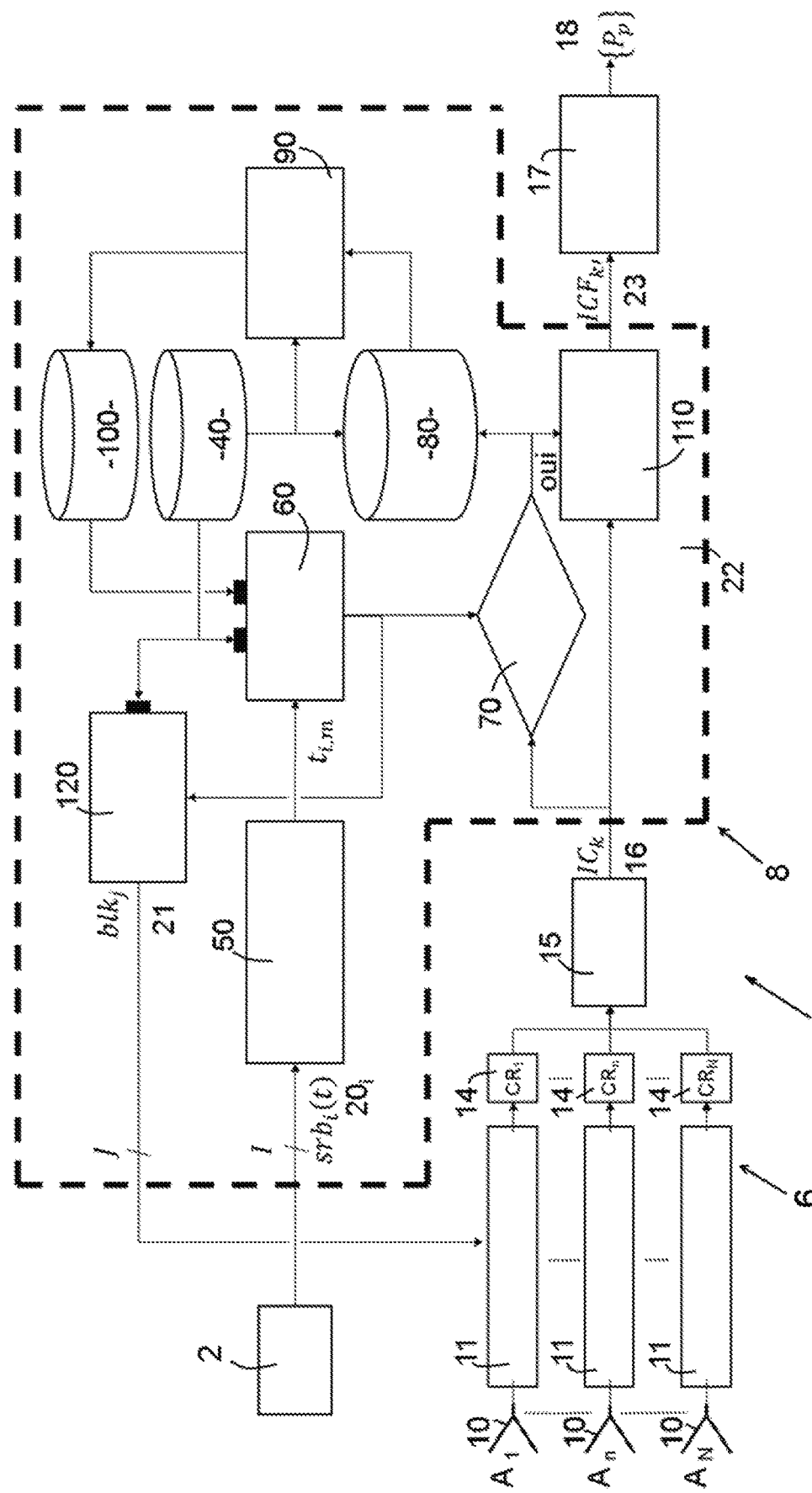
FIG. 2 shows the envelope of the signal received s by a radar detector 4 after the omission of the pulse ie.

FIGS. 1 to 8 illustrate the case where the emitted pulse being sufficiently short (FIG. 1), there is no temporal overlap between the direct component scd (FIG. 3) and the reflected onboard component scrb (FIG. 4), such that the received signal s has two pulses at the beginning of recurrence (FIG. 2).

FIGS. 9 to 24 illustrate the case where the conditions are such that there is this temporal overlap embodied by the crosshatched zone. In such a case, the radar detector 4 perceives the vectoral combination of the direct component scd and the reflected onboard component scrb. In general, the resultant envelope s is linked to the amplitude-phase relationships between these two signals. FIGS. 9 to 16 illustrate a situation of these two signals in phase and FIGS. 17 to 24, a situation in opposition. This is only a non-limiting example, since in application, these amplitude-phase relationships are not known or controlled. In fact, in some cases, the envelope has one or several successive pulses. Additionally, the situation is much more complicated if there are several reflected onboard components.

Figure 25:
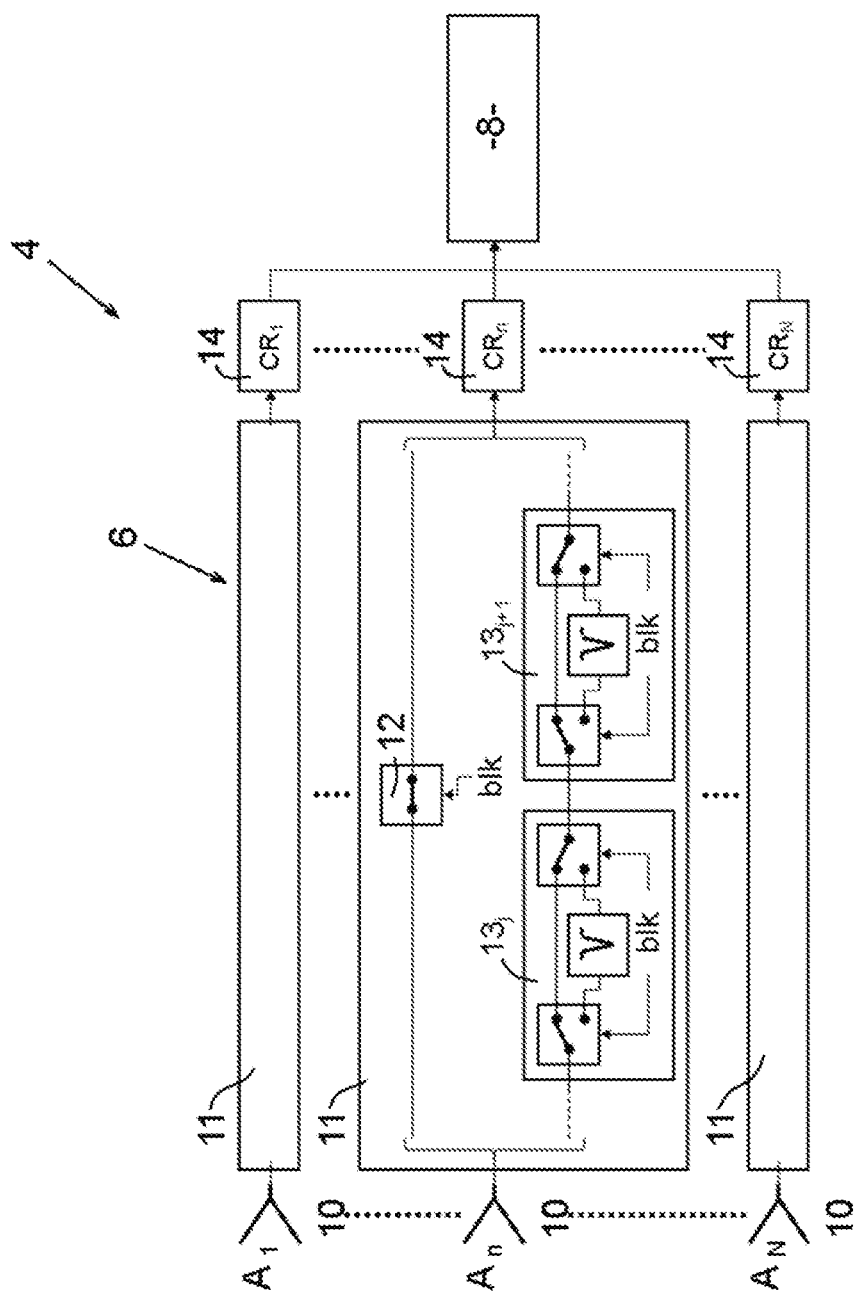
Figure 26:
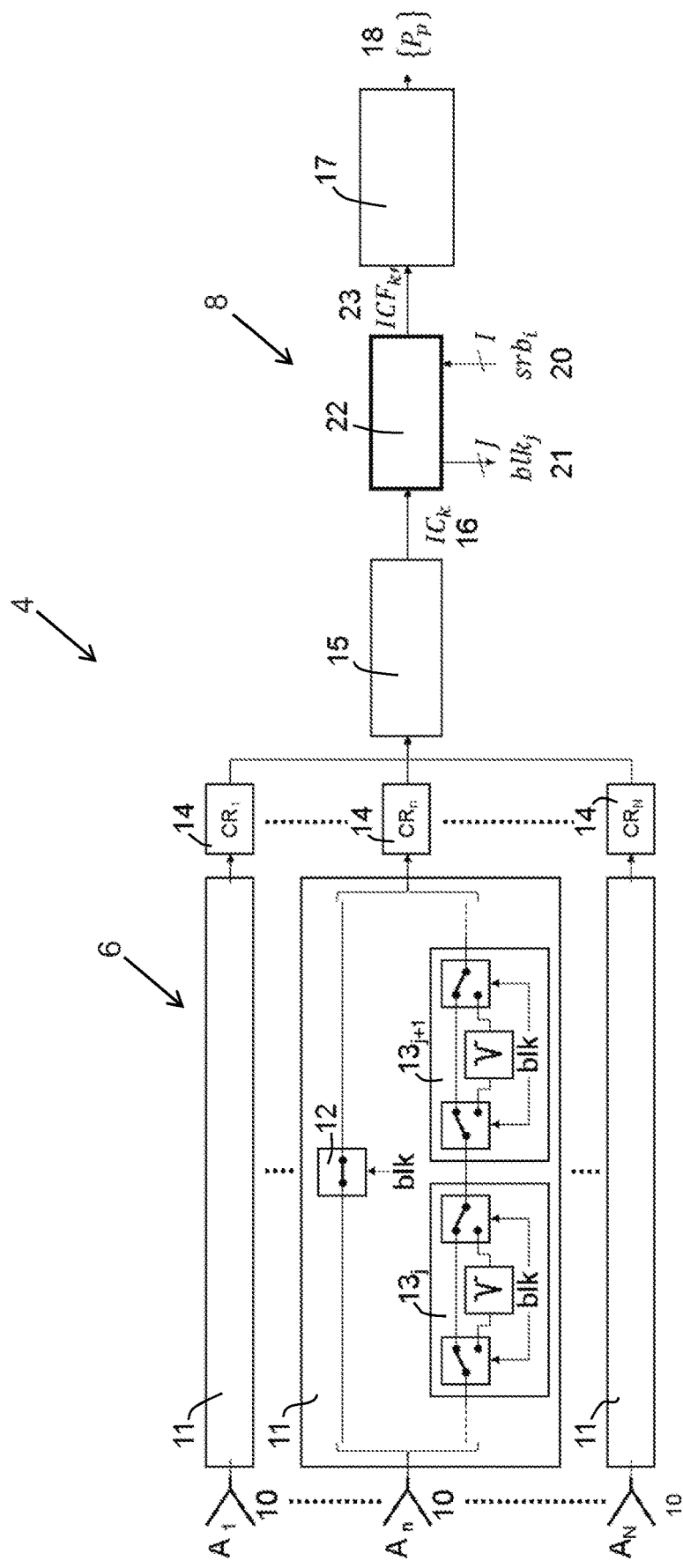

An example radar detector 4 is shown in FIG. 25.

The radar detector 4 includes two parts: a radar wave receiver 6 and a calculator 8.

The receiver 6 includes N channels.

N is an integer greater than or equal to 2 when the receiver 6 is able to implement goniometry.

According to another embodiment, the receiver 6 includes a single channel.

In FIG. 1, only three channels are shown: the first channel, the nth channel and the Nth channel. The presence of other channels is indicated by dotted lines.

Each channel includes an antenna 10 followed by an attenuator 11, the attenuator 11 being followed by a receiving chain 14.

Each antenna 10 is able to receive a radio signal and to deliver an electrical signal to the attenuator 11 from the received radio signal.

The set of antennas 10 allows the goniometry of the signals received by the antennas.

The attenuator 11 includes a set of attenuating elements of the signal.

The presence of the attenuator 11 makes it possible to guarantee the electromagnetic compatibility.

The attenuator 11 includes at least one switch 12.

The switch 12 is capable of allowing or not allowing a signal to pass.

According to one particular example, the switch 12 is a PIN diode with polarization controlled by the blanking signal and offering an attenuation of 40 to 60 dB.

According to the example of FIG. 25, the attenuator 11 includes J insertion devices 13 of a serial rejecter filter, each corresponding to the rejection of an appropriate frequency range with respect to onboard radars with an attenuation of about 30 to 60 dB.

Each receiving chain 14 is capable of delivering a signal such that the set of receiving chains 14 is capable of delivering N signals in parallel.

The calculator 8 is for example a set of digital components.

In a variant, the calculator 8 is a computer program product, such as a software program.

The calculator 8 is capable of carrying out steps of a method for testing the electromagnetic compatibility of the receiver 6 with the onboard pulse signal transmitters 2.

The operation of the radar detector 4 is now described in reference to FIGS. 26 to 32, which show a schematic view of the test method with several separate steps.

To that end, the calculator 8 is broken down into modules, this breakdown illustrating the different functions that the calculator 8 is capable of carrying out.

The calculator 8 includes a pulse characterization module 15, a development characterization and track characterization module 17 and a compatibility module 22 inserted between the two modules 15 and 17.

The pulse characterization module 15 is capable of analyzing the N signals that the receiver 6 is capable of delivering.

The pulse characterization module 15 is capable of characterizing each detectable incident radar pulse.

Such a characterization is implemented using at least one measurement of properties of the pulse.

A property is also called characteristic hereinafter (hence the term characterized pulses).

According to one example, the property is the date of arrival of the pulse t, which is the moment of arrival dating the front edge of the pulse.

According to another example, the property is the amplitude of the pulse A.

According to still another example, the property is the width of the pulse LI.

According to another embodiment, the property is the carrier frequency of the pulse f.

According to still another embodiment, the property is the intentional modulation on pulse IMOP and optionally the unintentional modulation on pulse UMOP, globally referred to as modulation on pulse MOP.

According to another example, the property is the direction of arrival $\theta$. For example, the direction of arrival is characterized by the azimuth, i.e., the angle of arrival in the local horizontal plane referenced relative to the geographical north. In a variant, the direction of arrival is characterized by the angle of elevation, i.e., the angle of arrival in the local vertical plane relative to the local horizontal.

According to another example, the property is the polarization of the carrier wave pol.

According to one specific example, the characterization is done using a plurality of measurements of properties of the pulse, each measurement being chosen from among the previous examples.

Hereinafter, it is assumed that the chosen properties are the date of arrival of the pulse t, the amplitude of the pulse A, the width of the pulse LI, the carrier frequency of the pulse f, the modulation on pulse MOP and the direction of arrival $\theta$.

Furthermore, hereinafter, each pulse is designated by the reference sign $IC_k$. k being an integer, the index k corresponding to the kth detected radar pulse.

For the kth detected radar pulse, these different properties are assigned an index k, hence the writing $IC_k = (t_k, A_k, LI_k, f_k, MOP_k, \theta_k)$.

The compatibility module 22 is capable of carrying out the test method. The method uses the characterized pulses $IC_k$, also designated by reference sign 16 corresponding to the onboard radars, to optimize the use of the attenuator 11 and to be able to eliminate, from the flow $\{IC_k\}$, the characterized pulses corresponding to the onboard radars and to transmit a filtered flow of characterized pulses $\{ICF_{k'}\}$, also designated by reference sign 23, to the track development and characterization module 17.

To that end, the compatibility module 22 includes a plurality of modules visible in FIG. 27. These modules are a module 40 for storing predefined properties, a module 50 for measuring date of arrival, a module 60 for forming ranges, a module 70 for comparing a characterized pulse with a range, a module 80 for storing recalibrated characterized pulses, a calculating module 90, a module 100 for storing calculated properties, a module 110 for eliminating characterized pulses and a module 120 for developing blankings.

The flow of characterized pulses $\{IC_k\}$ is processed by a module 17 for developing and characterizing tracks, the tracks 18 being objects synthesizing the set of characteristics of the radar that are perceptible over time (recurrence, antenna radiation, various modulations).

We will now outline the test method in reference to FIGS. 27 to 32.

The method includes two phases, namely a training phase and an elimination phase.

The two phases are paced by the various synchronization signals from the onboard radars.

The training phase serves to acquire a fine characterization of the signals derived from the pulses emitted by the onboard radars owing to the characterized pulses $IC_k$ in order to form elimination ranges allowing precise control of the elimination phase, the characterized pulses $IC_k$ being selected owing to acquisition ranges.

The training phase is implemented for each onboard radar.

The training phase includes three acquisition subphases: a first subphase for acquiring the onboard component (mixing of the direct component scd and the onboard reflected component scrb, a second subphase for acquiring the reflected clutter component scrf and a third subphase for acquiring the component reflected on outside isolated objects scre.

Each of the three subphases comprises a first step for acquiring characterized pulses $IC_k$ and a second calculating step.

Figure 28:
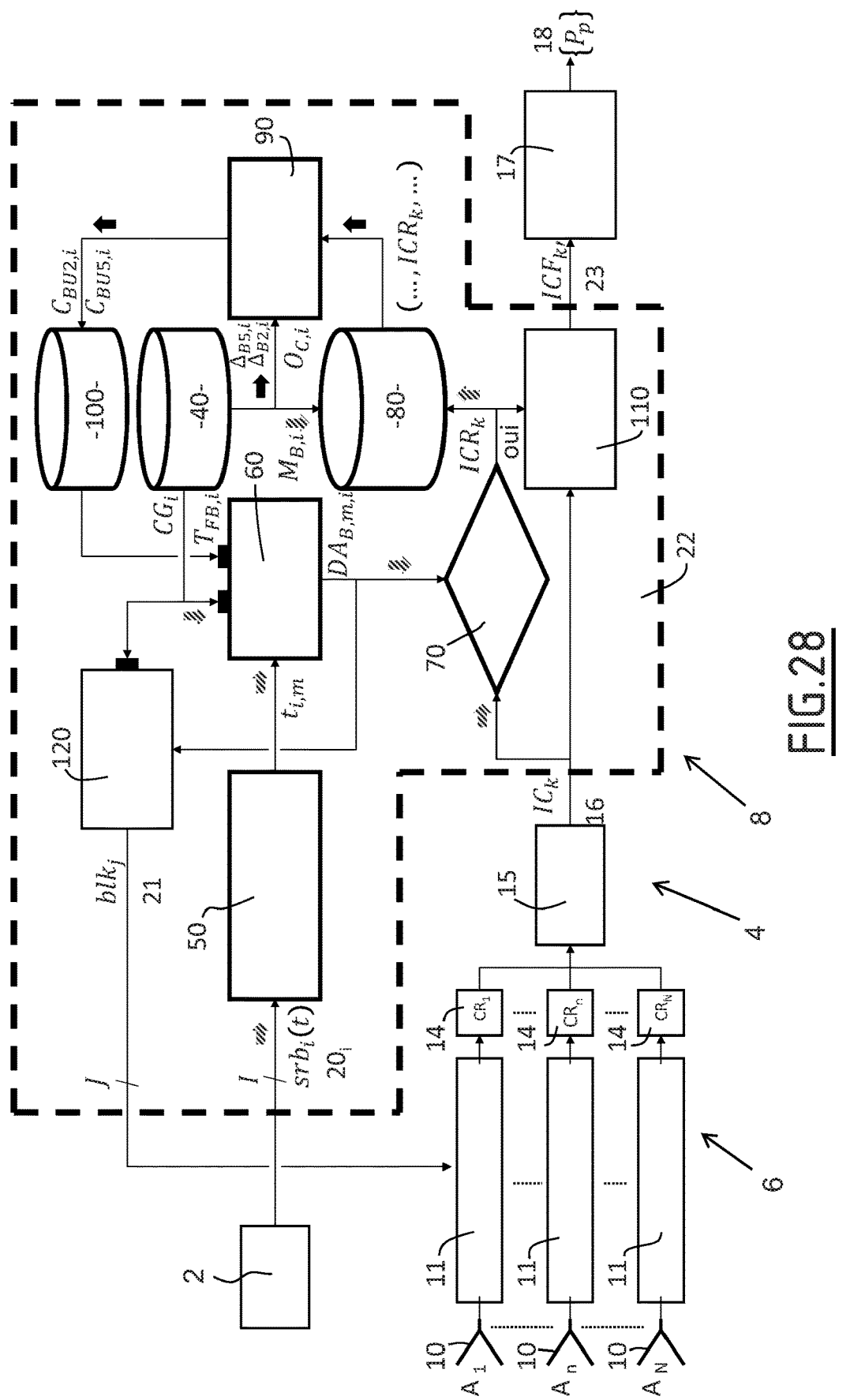
Figure 29:
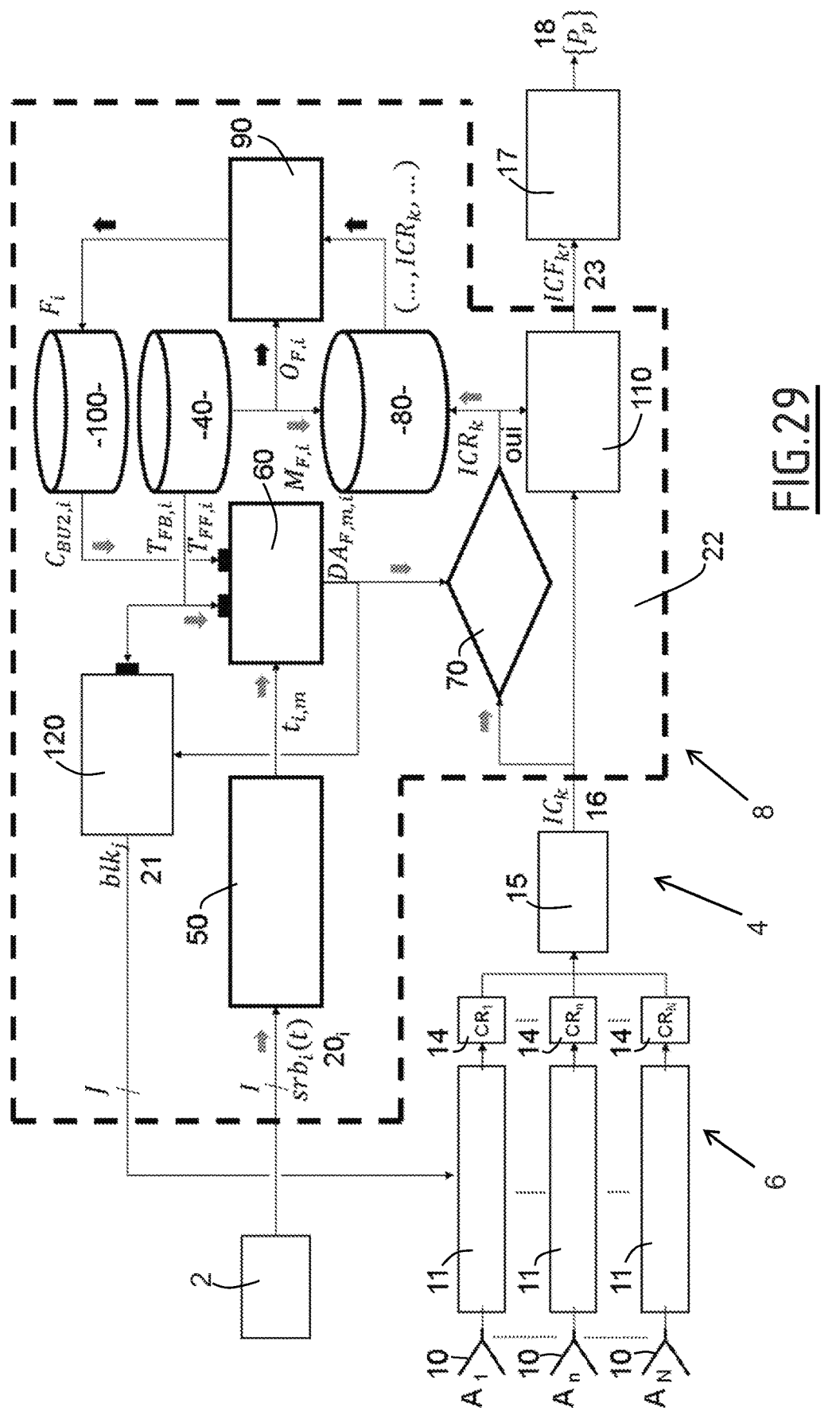
Figure 30:
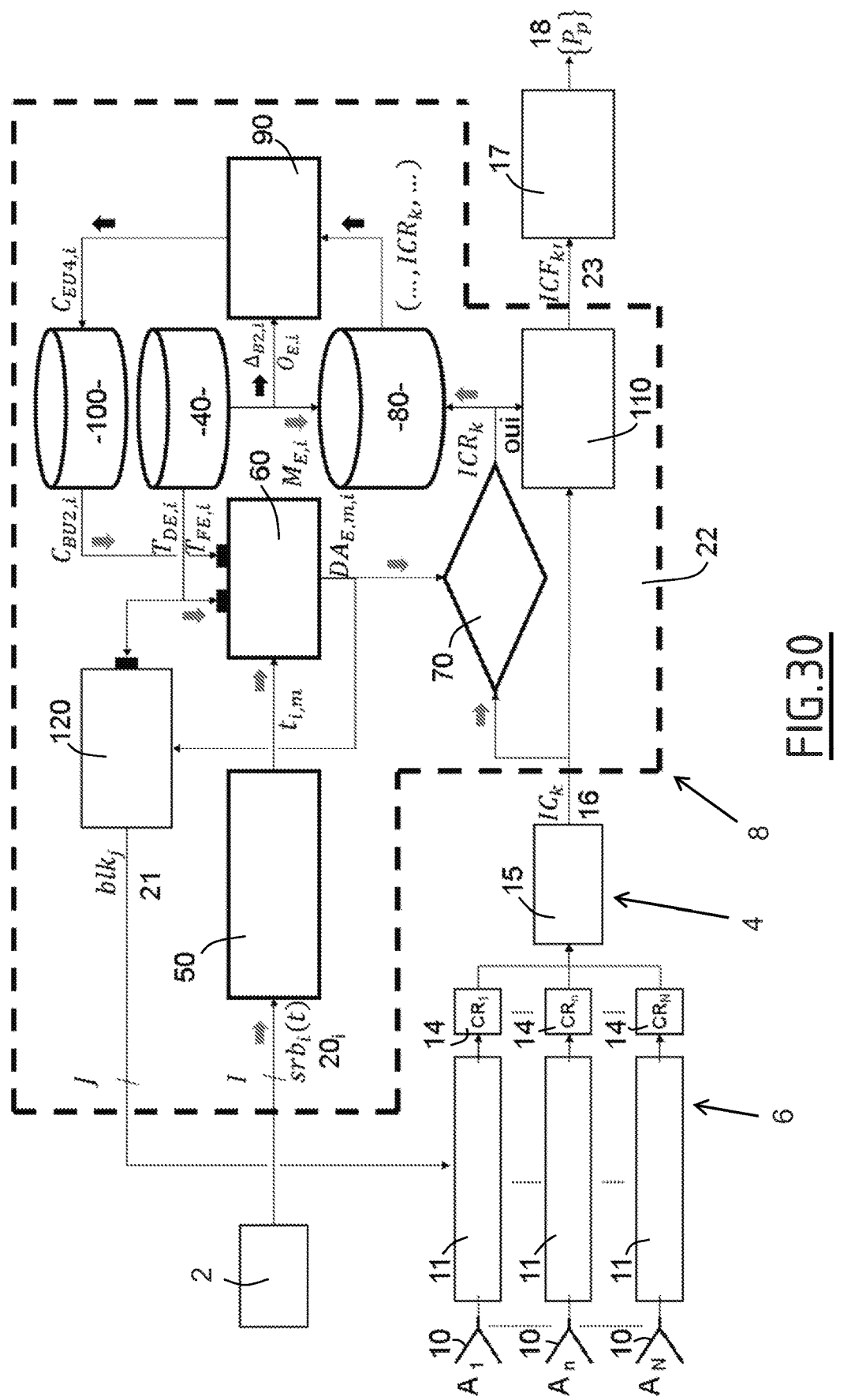

FIGS. 28 to 30 respectively correspond to the three acquisition subphases. Each of the figures show the functions used in thick lines and the useful data enhanced by an arrow, to indicate the path, crosshatched for those used for the first acquisition steps and in solid black for those used for the second calculating steps.

For each onboard radar, each first acquisition step is paced by the synchronization signal of the onboard radar in question $srb_i$.

Each first acquisition step includes a measurement, a formation and a comparison.

During the measurement, a measurement is done of the date of arrival $t_{m,i}$ of the front edge of the m-th pulse of the synchronization signal $srb_i$ of the i-th onboard radar. Such a measurement is implemented by the date of arrival measuring module 50, in coherence with the dates of arrival measured by the module for characterizing the pulses 15 situated upstream from the radar detector 4, i.e., with the same origin, resolution and time measuring precision.

During the formation, an acquisition range $DA_{m,i}$ is formed specific to each subphase and corresponding to this mth pulse of the synchronization signal $srb_i$ of the ith onboard radar. The formation is carried out by the range forming module 60.

During the comparison, the incident characterized pulses $IC_k$ are compared to the acquisition range $DA_{m,i}$. The comparison is implemented by the module for comparing a characterized pulse with a range 70.

If the characterized pulse $IC_k$ is contained in the range $DA_{m,i}$, then the pulse is stored by the module for storing recalibrated characterized pulses 80, recalibrated in time relative to the date of arrival of the synchronization pulse of the onboard radar that has just been measured, i.e., in the form $ICR_k = (\delta t_k, A_k, LI_k, f_k, MOP_k, \theta_k)$ where $\delta t_k = t_k - t_{m,i}$, otherwise the pulse is not used.

To be representative in quantity, the recalibrated characterized pulses $ICR_k$ correspond to a number of synchronization pulses reaching at least $M_i$, value specific to the ith onboard radar but also to each subphase.

FIG. 28 illustrates the first acquisition subphase of the onboard component, $M_i = M_{B,i}$ a value further predefined and coming from the module for storing predefined properties 40, and the acquisition range $DA_{m,i} = DA_{B,m,i}$ is formed by the range forming module 60 from, for example:
- a range of general characteristics of the pulses of the ith onboard radar, $CG_i$, the range being further predefined and coming from the module for storing predefined properties 40, which may comprise $Q_i$ definition classes, $Q_i$ being an integer greater than or equal to 1, $CG_i = [\ldots, CG_{i,q_i}, \ldots]$ where $CG_{i,q_i} = [(LI_{min,i,q_i}, LI_{max,i,q_i}), (f_{min,i,q_i}, f_{max,i,q_i}), (MOP_{min,i,q_i}, MOP_{max,i,q_i})]$ and $q_i$ an integer from 1 to $Q_i$;
- a duration $T_{FB,i}$ defining a maximum time range relative to $t_{m,i}$ and during which the dates of arrival of the onboard component can be, and
- the date of arrival of the front edge of the mth pulse of the ith onboard radar $t_{m,i}$ coming from the module for measuring date of arrival 50.

The acquisition range is calculated as follows:

$$DA_{B,m,i} = \left[\ldots, \begin{bmatrix}(t_{m,i}, t_{m,i} + T_{FB,i}), (LI_{min,i,q_i}, LI_{max,i,q_i}), \\ (f_{min,i,q_i}, f_{max,i,q_i}), (MOP_{min,i,q_i}, MOP_{max,i,q_i})\end{bmatrix}, \ldots\right].$$

FIG. 29 illustrates the second acquisition subphase, $M_i = M_{F,i}$ a value further predefined and coming from the module for storing predefined properties 40, and the acquisition range $DA_{m,i} = DA_{F,m,i}$ is formed by the range forming module 60 from:
- useful onboard classes $C_{BU2,i} = [\ldots, C_{BU2,i,l'_{2,i}}, \ldots]$
  where $C_{BU2,i,l'_{2,i}} = [(\delta t_{min,i,l'_{2,i}}, \delta t_{max,i,l'_{2,i}}), (f_{min,i,l'_{2,i}}, f_{max,i,l'_{2,i}})]$ with $l'_{2,i}$ an integer from 1 to $L'_{2,i}$, coming from the module for storing calculated properties 100 and established by the second calculating step of the first acquisition subphase;
- durations $T_{FB,i}$ and $T_{FF,i}$ defining a maximum time range relative to $t_{m,i}$ and during which the dates of arrival of the clutter component can be;
- the date of arrival of the front edge of the mth pulse of the ith onboard radar $t_{m,i}$ coming from the module for measuring date of arrival 50.

The acquisition range $DA_{F,m,i}$ is calculated as follows:

$$DA_{F,m,i} = \left[\ldots, \begin{bmatrix}(t_{m,i} + \delta t_{min,i,l'_{2,i}} + T_{FB,i}, t_{m,i} + \delta t_{min,i,l'_{2,i}} + T_{FF,i}), \\ (f_{min,i,l'_{2,i}}, f_{max,i,l'_{2,i}})\end{bmatrix}, \ldots\right].$$

FIG. 30 illustrates the third acquisition subphase, $M_i = M_{E,i}$ a value further predefined and coming from the module for storing predefined properties 40, and the acquisition range $DA_{m,i} = DA_{E,m,i}$ is formed by the range forming module 60 from:
- useful onboard classes $C_{BU2,i} = [\ldots, C_{BU2,i,l'_{2,i}}, \ldots]$
  with $C_{BU2,i,l'_{2,i}} = [(\delta t_{min,i,l'_{2,i}}, \delta t_{max,i,l'_{2,i}})]$ and $l'_{2,i}$ an integer from 1 to $L'_{2,i}$, where $L'_{2,i}$, coming from the module for storing calculated properties 100 and established by the second calculating step of the first acquisition subphase
- durations $T_{DE,i}$ and $T_{FE,i}$ defining a maximum time range relative to $t_{m,i}$ and during which the dates of arrival of the external echo component can be;
- the date of arrival of the front edge of the mth pulse of the ith onboard radar $t_{m,i}$ coming from the module for measuring date of arrival 50.

The acquisition range $DA_{E,m,i}$ is calculated as follows:

$$DA_{E,m,i} = \left[\ldots, \begin{bmatrix}(t_{m,i} + \delta t_{min,i,l'_{2,i}} + T_{DE,i}, t_{m,i} + \delta t_{min,i,l'_{2,i}} + T_{FE,i}), \\ (f_{min,i,l'_{2,i}}, f_{max,i,l'_{2,i}})\end{bmatrix}, \ldots\right].$$

All of the first acquisition steps stop when the number of synchronization pulses, for the ith onboard radar, reaches $M_i$ a value specific to each subphase, the set of recalibrated characterized pulses thus acquired ( . . . , $ICR_k$, . . . ) is used by the second calculating step of the considered acquisition subphase.

For the first acquisition subphase, the second calculating part comprises a first distribution, a second distribution, a grouping and a determination.

During the first distribution, the recalibrated characterized pulses $ICR_k$ of the set ( . . . , $ICR_k$, . . . ) coming from the module for storing recalibrated characterized pulses 80 are distributed into classes according to the five properties St, A, LI, f and MOP, delivering a number of recalibrated characterized pulses $H_{BB5,i,l_{5,i}}$ by raw onboard classes.

$$C_{BB5,i,l_{5,i}} = \begin{bmatrix} (\delta t_{min,i,l_{5,i}}, \delta t_{max,i,l_{5,i}}), (A_{min,i,l_{5,i}}, A_{max,i,l_{5,i}}), (LI_{min,i,l_{5,i}}, LI_{max,i,l_{5,i}}), \\ (f_{min,i,l_{5,i}}, f_{max,i,l_{5,i}}), (MOP_{min,i,l_{5,i}}, MOP_{max,i,l_{5,i}}) \end{bmatrix}$$

where $l_{5,i}$ is an integer from 1 to $L_{5,i}$, $L_{5,i}$ being the number of classes.

This first distribution corresponds to a histogram.

During the second distribution, the recalibrated characterized pulses $ICR_k$ of the set ( . . . , $ICR_k$, . . . ) coming from the module for storing recalibrated characterized pulses 80 are distributed into classes according to the two properties δt and f, delivering a number of recalibrated characterized pulses $H_{BB2,i,l_{2,i}}$ by raw onboard class $C_{BB2,i,l_{2,i}} = [(\delta t_{min,i,l_{5,i}}, \delta t_{max,i,l_{5,i}}), (f_{min,i,l_{5,i}}, f_{max,i,l_{5,i}})]$ where $l_{2,i}$ is an integer from 1 to $L_{2,i}$, $L_{2,i}$ being the number of classes.

This second distribution corresponds to a histogram.

During the grouping, for each of the two distributions, raw onboard classes that are too close together are grouped together.

Two classes are considered to be too close if the distance between class centers is below a predefined value, $\Delta_{B5,i}$ and $\Delta_{B2,i}$, respectively, for the first and second distributions coming from the module for storing predefined properties 40, depending on natural dispersions produced by the onboard radar and measuring dispersions of the radar detector 4 relative to each property defining the class.

During the determination, useful onboard classes are determined from onboard classes after grouping for each of the two distributions, the useful class being a class whereof the number of elements is greater than or equal to the predefined threshold coming from the module for storing predefined properties 40.

A first set of useful onboard classes $C_{BU5,i}$ is thus obtained stored in the module for storing calculated properties 100, comprising $L'_{5,i}$ classes remaining after grouping and thresholding, each useful onboard class being defined by:

$$C_{BU5,i,l'_{5,i}} = \begin{bmatrix} (\delta t_{min,i,l'_{5,i}}, \delta t_{max,i,l'_{5,i}}), (A_{min,i,l'_{5,i}}, A_{max,i,l'_{5,i}}), (LI_{min,i,l'_{5,i}}, LI_{max,i,l'_{5,i}}), \\ (f_{min,i,l'_{5,i}}, f_{max,i,l'_{5,i}}), (MOP_{min,i,l'_{5,i}}, MOP_{max,i,l'_{5,i}}) \end{bmatrix}$$

where $l'_{5,i}$ is an integer from 1 to $L'_{5,i}$, a second set of useful onboard classes $C_{BU2}$ is thus obtained stored in the module for storing calculated properties 100, comprising $L'_{2,i}$ classes remaining after grouping and thresholding, each useful onboard class being defined by $C_{BU2,i,l'_{2,i}} = [(\delta t_{min,i,l'_{2,i}}, \delta t_{max,i,l'_{2,i}}), (f_{min,i,l'_{2,i}}, f_{max,i,l'_{2,i}})]$ where $l'_{2,i}$ is an integer from 1 to $L'_{2,i}$ (as a reminder, the indices and numbers assigned an apostrophe "'" are those after grouping and thresholding so as not to confuse them with those before this task).

In a variant, the number of five properties, according to which the classes of the first distribution are created, is different, in particular smaller.

According to another example, having only the second distribution only using the two indicated properties can be considered.

According to another example, the elimination of classes by thresholding is done before the grouping.

For the second subphase for acquisition of the reflected clutter component, the second calculating part (FIG. 29) comprises a distribution and a search.

During the distribution, the recalibrated characterized pulses $ICR_k$ of the set ( . . . , $ICR_k$, . . . ) coming from the module for storing recalibrated characterized pulses 80 are distributed into classes according to the two properties δt and f, delivering a number of recalibrated characterized pulses $H_{F2,i,r_{2,i}}$ by clutter classes $C_{F2i,r_{2,i}} = [(\delta t_{min,i,r_{2,i}}, \delta t_{max,i,r_{2,i}}), (f_{min,i,r_{2,i}}, f_{max,i,r_{2,i}})]$ where $r_{2,i}$ is an integer from 1 to $R_{2,i}$, $R_{2,i}$ being the number of classes.

This distribution corresponds to a histogram.

In the case at hand, the continuous nature of the clutter, in particular of the sea clutter, causes the radar detector 4 to measure a pulse width equal to the maximum value for which the radar detector 4 is designed, and several times in a row over time as long as its sensitivity allows it to detect this clutter. Thus, the value of LI is practically unique and the delay classes δt are numerous and continuous.

During the search, delay classes ($\delta t_{min,i,r_{2,i}}, \delta t_{max,i,r_{2,i}}$) are sought. More specifically, the delay classes are sought from which the numbers $H_{F2,i,r_{2,i}}$ with a constant frequency class ($f_{min,i,r_{2,i}}, f_{max,i,r_{2,i}}$) are below a predefined threshold value $O_{F,i}$ and coming from the module for storing predefined properties 40, for $r_{2,i}'$ an integer from 1 to $R_{2,i}$ and $r_{2,i}$ a constant integer when $r_{2,i}'$ sweeps all of the delay classes, $r_{2,i}$ going from 1 to $R_{2,i}$.

One thus obtains a set $F_i$ stored in the module for storing calculated properties 100, of $R_{2,i}$ frequency classes $f_{min,i,r_{2,i}}$, $f_{max,i,r_{2,i}}$) each associated with a delay class ($\delta t_{min,i,r'_{2,i}(r_{2,i})}$, $\delta t_{max,i,r'_{2,i}(r_{2,i})}$, Where:

$r_{2,i}$ is an integer from 1 to $R_{2,i}$, $F_i = ( . . . , [f_{min,i,r_{2,i}}, f_{max,i,r_{2,i}}), (\delta t_{min,i,r'_{2,i}(r_{2,i})}, \delta t_{max,i,r'_{2,i}(r_{2,i})})], . . . )$.

$F_i$ corresponds to a clutter map expressing a presence of bothersome estimated clutter for given frequency classes as a function of delay classes, in other words as a function of given distance classes, since, like for a radar, the delay multiplied by half the wave propagation speed (150 m/µs) gives the distance.

For the third subphase for acquisition of the reflected component on outside isolated objects, the second calculating part (FIG. 29) comprises a distribution, a grouping and a determination.

During the distribution, the recalibrated characterized pulses $ICR_k$ of the set ( . . . , $ICR_k$, . . . ) coming from the module for storing recalibrated characterized pulses 80 are distributed into classes according to the four properties δt, LI, f and θ, delivering a number of recalibrated characterized pulses $H_{EB4,i,u_{4,i}}$ by raw external echo classes $$C_{EB4,i,u_{4,i}} = \begin{bmatrix} (\delta t_{min,i,u_{4,i}}, \delta t_{max,i,u_{4,i}}), (LI_{min,i,u_{4,i}}, LI_{max,i,u_{4,i}}), \\ (f_{min,i,u_{4,i}}, f_{max,i,u_{4,i}}), (\theta_{min,i,u_{4,i}}, \theta_{max,i,u_{4,i}}) \end{bmatrix},$$

where $u_{4,i}$ is an integer from 1 to $U_{4,i}$, $U_{4,i}$ being the number of classes.

This distribution corresponds to a histogram.

During the grouping, the raw external echo classes that are too close together are grouped together. Two classes are considered to be too close if the distance between class centers is below a further predefined value, $\Delta_{E3,i}$ derived from 40, depending on natural dispersions produced by the onboard radar and measuring dispersions of the radar detector 4 relative to each property defining the class.

During the determination, the useful external echo classes are grouped together from external echo classes after grouping, a useful class being a class whereof the number of elements is further greater than or equal to the predefined threshold $O_{c,i}$ and coming from the module for storing predefined properties 40.

A set of useful onboard classes $C_{EU4,i}$ is thus obtained stored in the module for storing calculated properties 100, comprising $U'_{4,i}$ is the number of classes remaining after grouping and thresholding, each class being defined by:

$$C_{EU4,i,u'_{4,i}} = \begin{bmatrix} (\delta t_{min,i,u'_{4,i}}, \delta t_{max,i,u'_{4,i}}), (LI_{min,i,u'_{4,i}}, LI_{max,i,u'_{4,i}}), \\ (f_{min,i,u'_{4,i}}, f_{max,i,u'_{4,i}}), (\theta_{min,i,u'_{4,i}}, \theta_{max,i,u'_{4,i}}) \end{bmatrix}$$

where $u'_{4,i}$ is an integer from 1 to $U'_{4,i}$.

$C_{EU4,i}$ corresponds to a map of the angle-distance echoes with a given frequency class and pulse width, distance because, like for a radar, the delay multiplied by half the wave propagation speed (150 m/µs) gives the distance.

In a variant, the elimination of classes by thresholding is carried out before the grouping.

$$DE_{BF,m,i} = \begin{bmatrix} \ldots, \begin{bmatrix} (t_{m,i} + \delta t_{min,i,l'_{5,i}}, t_{m,i} + \delta t_{max,i,l'_{5,i}}), \\ (A_{min,i,l'_{5,i}}, A_{max,i,l'_{5,i}}), \\ (LI_{min,i,l'_{5,i}}, LI_{max,i,l'_{5,i}}), (f_{min,i,l'_{5,i}}, f_{max,i,l'_{5,i}}), \\ (MOP_{min,i,l'_{5,i}}, MOP_{max,i,l'_{5,i}}) \end{bmatrix}, \ldots \end{bmatrix} + \begin{bmatrix} \ldots, \left[ (t_{m,i} + \delta t_{min,i,r'_{2,i}(r_{2,i})}, t_{m,i} + \delta t_{max,i,r'_{2,i}(r_{2,i})}), (f_{min,i,r_{2,i}}, f_{max,i,r_{2,i}}) \right], \ldots \end{bmatrix}$$

The purpose of the elimination phase is to eliminate the signals derived from the onboard radars by implementing elimination ranges, developed from elements learned by the training phase.

The elimination phase is implemented according to two different action modes, the action mode at the signal level and the action mode at the characterized pulse level $IC_k$.

The action mode at the signal level acts by attenuating the signal owing to the attenuator 11 controlled by an appropriate set of blinking signals.

The action mode at the characterized pulse level acts directly by eliminating characterized pulses (data elimination).

In the illustrated example, the elimination phase uses two different elimination ranges, a first dedicated to eliminating onboard and clutter components $DE_{BF,m,i}$ and a second dedicated to eliminating external echo components $DE_{EE,m,i}$.

For a same onboard radar, the two elimination ranges are generally established in parallel unless there is no reason to produce them due to an absence of classes at the end of the training phase (for example, no external echo detected for $DE_{EE,m,i}$).

A given elimination range is only used by one action mode at a time.

The two elimination ranges are implemented indifferently by the same action mode or each by a different action mode.

According to one particular example, the action mode at the signal level is reserved for the saturating components that may deteriorate the operation of the radar detector 4; this action mode is therefore rather reserved for the elimination range $DE_{BF,m,i}$.

Figure 31:
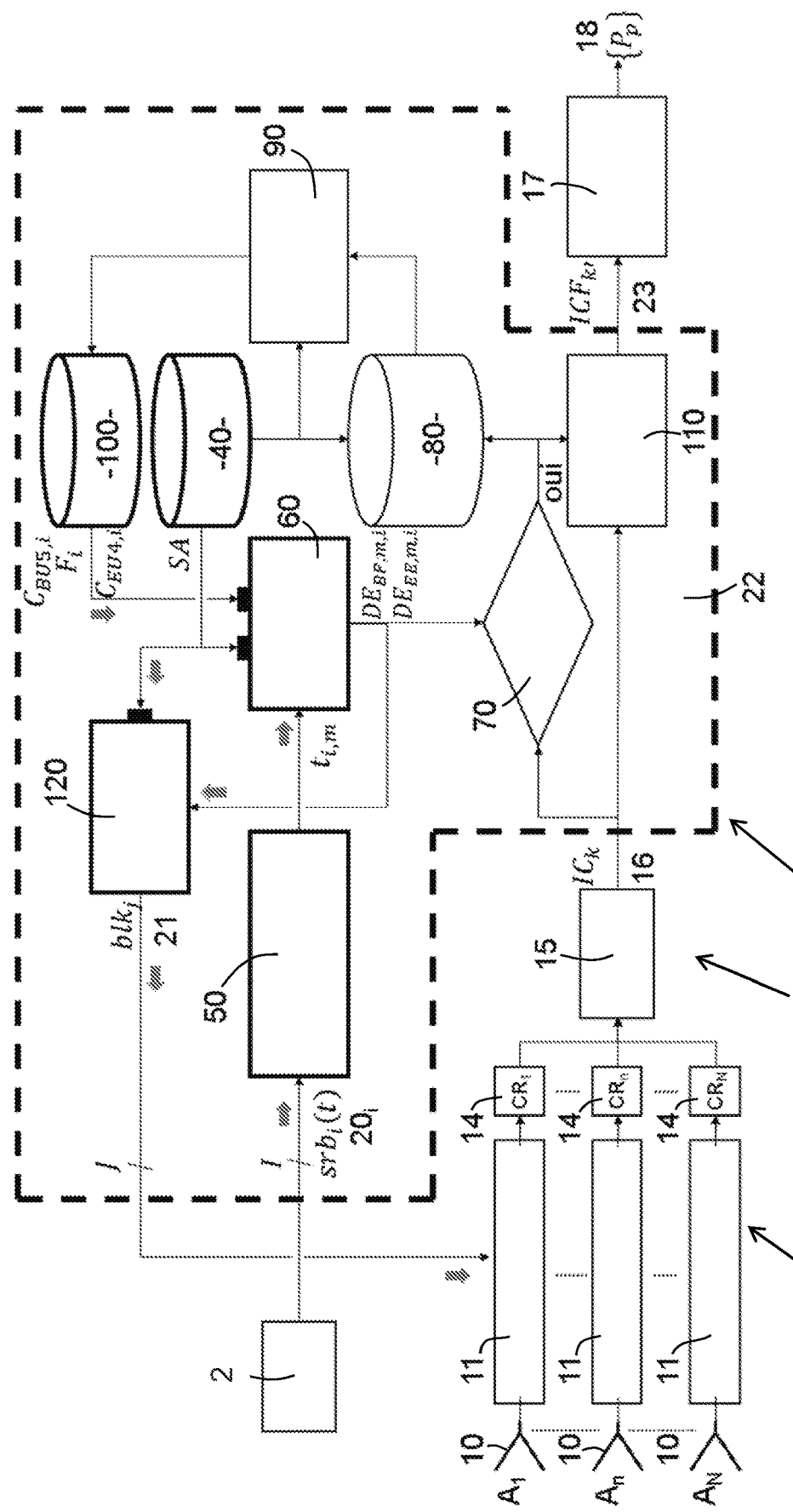
Figure 32:
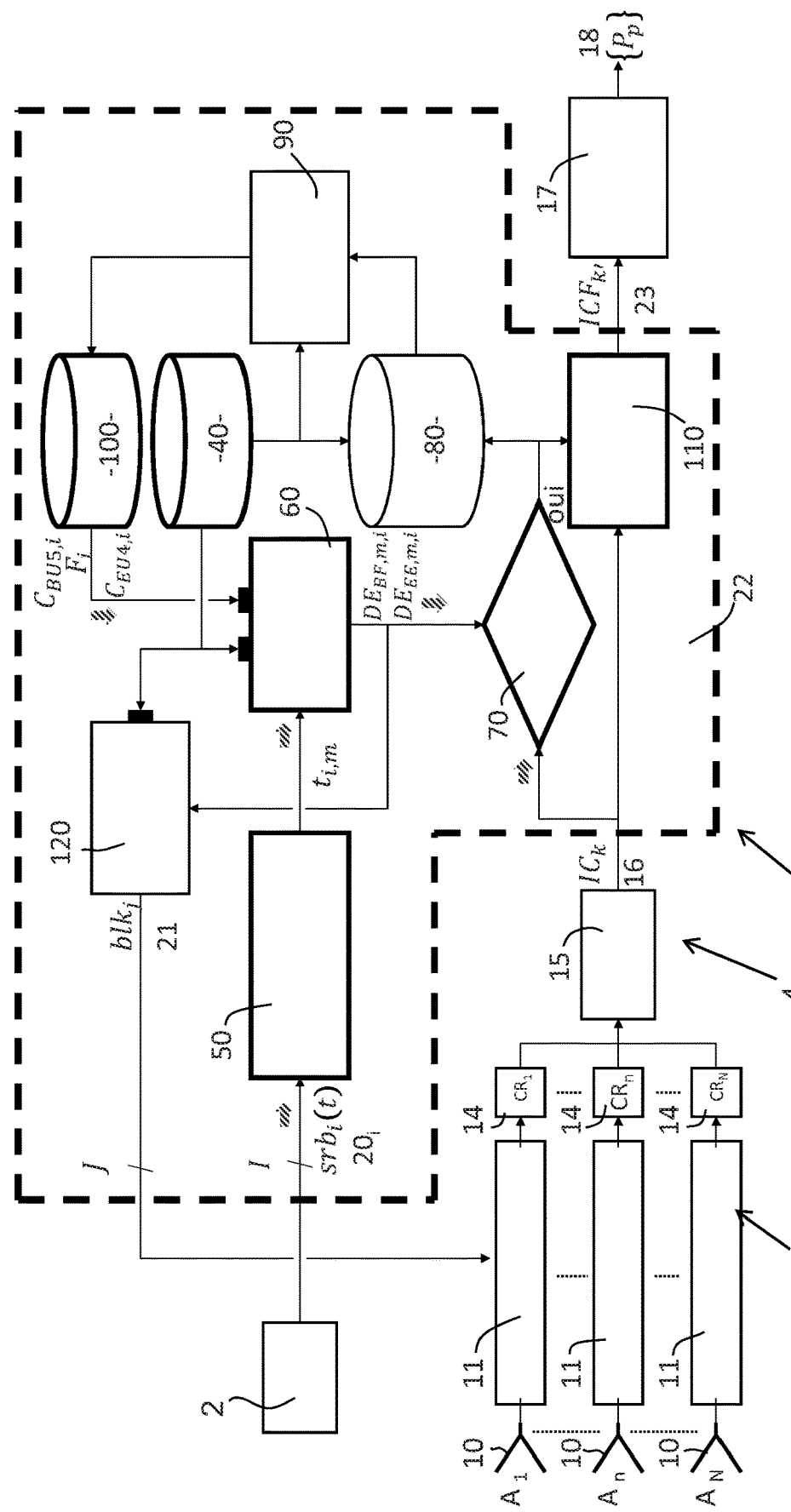

FIGS. 31 and 32 respectively illustrate the operation of the action modes at the signal level and at the characterized pulse level of the elimination phase. Each of FIGS. 31 and 32 show the functions used in thick lines and the useful data enhanced by a crosshatched arrow to indicate the path.

The elimination range dedicated to the onboard and clutter components $DE_{BF,m,i}$ is formed by the range formation module 60 from:

the set $C_{BU5,i}$ of $L'_{5,i}$ classes and the set $F_i$ of $R_{2,i}$ frequency classes $(f_{min,i,r_{2,i}}, f_{max,i,r_{2,i}})$, each associated with a delay class $(\delta t_{min,i,r'_{2,i}(r_{2,i})}, \delta t_{max,i,r'_{2,i}(r_{2,i})})$, $r_{2,i}$ going from 1 to $R_{2,i}$, these sets coming from the module for storing calculated properties 100 that has stored them from the training phase, and the date of arrival of the front edge of the mth pulse of the ith onboard radar $t_{m,i}$ coming from the module for measuring date of arrival 50.

For example, the elimination range is calculated as follows:

with $l'_{5,i}$ from 1 to $L'_{5,i}$ and $r_{2,i}$ from 1 to $R_{2,i}$.

The elimination range dedicated to the external echo components $DE_{EE,m,i}$ is formed by the range formation module 60 from:

the set $C_{EU4,i}$ of $U'_{4,i}$ classes coming from the module for storing calculated properties 100 that stored it during the training phase, and the date of arrival of the front edge of the mth pulse of the ith onboard radar $t_{m,i}$ coming from the module for measuring date of arrival 50.

For example, the elimination range is calculated as follows:

$u'_{4,i}$ with $$DE_{EE,m,i} = \begin{bmatrix} \ldots, \begin{bmatrix} (t_{m,i} + \delta t_{min,i,u'_{4,i}}, t_{m,i} + \delta t_{max,i,u'_{4,i}}), (LI_{min,i,u'_{4,i}}, LI_{max,i,u'_{4,i}}), \\ (f_{min,i,u'_{4,i}}, f_{max,i,u'_{4,i}}), (\theta_{min,i,u'_{4,i}}, \theta_{max,i,u'_{4,i}}) \end{bmatrix}, \ldots \end{bmatrix}$$

an integer from 1 to $U'_{4,i}$.

For each onboard radar, the elimination phase is paced by the synchronization signal of the onboard radar in question $srb_i$.

For both action modes, a first part is identical, establishing, upon each pulse of this synchronization signal, a measurement of the date of arrival $t_{m,i}$ of the front edge of the mth pulse of the synchronization signal $srb_i$ of the ith onboard radar is done by the date of arrival measuring module 50, in coherence with the dates of arrival measured by the module for characterizing the pulses 15 situated upstream from the radar detector 4, i.e., with the same origin, resolution and time measuring precision.

Also formed is an elimination range $DE_{m,i}$ depending on the components to be eliminated and corresponding to this mth pulse of the synchronization signal $srb_i$ of the ith onboard radar signal is done by the range forming module 60.

For the action mode at the signal level, the first part of the elimination phase is followed, as shown in FIG. 31, by a part specific to the mode with the module for developing blankings 120, developing a set off blanking signals $blk_j$ (21), j being an integer from 1 to J and J being an integer greater than or equal to 1, capable of reproducing, for a given onboard radar, one of the two elimination ranges or both depending on the choice made, and for all of the onboard radars, the set of elimination ranges in force formed by the module for forming ranges 60 (first part), taking into account the definition SA of the attenuator 11, which is further a set of predefined data and stored in the module for storing predefined properties 40.

For the action mode at the characterized pulse level $IC_k$, the first part of the elimination phase is followed, as shown in FIG. 32, by a specific part comprising a comparison and an elimination.

During the comparison, the incident characterized pulses $IC_k$ are compared to the set of elimination ranges entrusted for the set of onboard radars, coming from the module for forming ranges 60 (first part), i.e., same function as that of the acquisition subphases of the training phase.

During the elimination, the characterized pulse $IC_k$ of the flow $\{IC_k\}$ is eliminated by the module for eliminating characterized pulses 110 if the characterized pulse $IC_k$ is contained in any elimination range, otherwise, the characterized pulse $IC_k$ is left in this flow, the flow provided to the module 17 for developing and characterizing tracks is thus a filtered flow $\{/CF_{k'}\}$.

For a given onboard radar, the training phase is completed to begin the elimination phase. To account for any changes over time, waveforms and use of a considered onboard radar, the training phase is restarted periodically to obtain control of the updated elimination phase. In such a case, the elimination phase at the signal must be stopped, otherwise the elimination in progress will make the sought characterized pulses impossible, or at best, incorrect.

In general, during a training phase on a given onboard radar, the elimination phases should be stopped at the signal level regarding the other on board radars.

The elimination phase of the characterized pulses has no impact on the training phase. Control of the elimination phase of the characterized pulses, incorrect because not updated, does not appear bothersome because stopping the phase will not do better and the elimination of wanted characterized pulses is no more likely than with a correct control.

In the context of a platform equipped with a radar detector 4 and at least one onboard pulse signal transmitter 2, the method provides better electromagnetic compatibility between the radar detector 4 and each onboard transmitter 2.

It should be noted that the effect is always obtained by carrying out the method only on one of the components, for example on the onboard component, the clutter component or the external echo component.

The invention claimed is:

1. A method for testing an electromagnetic compatibility of a radar detector with at least one onboard pulse signal transmitter, the radar detector and each onboard transmitter belonging to a same platform, by eliminating an external echo component in signals received by the radar detector, the method comprising:
a training phase including, for each onboard transmitter:
an acquisition subphase seeking to obtain detected pulses, each pulse being characterized by characteristics, the characteristics including at least a date of arrival of the pulse and a carrier frequency of the pulse, the subphase including:
acquiring signals derived from pulses emitted by the onboard transmitter and each corresponding to the external echo component, to obtain the detected pulses, and
acquiring characteristic measurements of the detected pulses,
a computing subphase including:
distributing the detected pulses into classes grouping together the pulses for which at least two characteristics have a shared value range, and
selecting classes including a number of pulses greater than or equal to a predetermined threshold, to obtain selected classes, and
an elimination phase including:
building an elimination range, the elimination range being a set of pulses detectable by the radar detector belonging to the selected classes, and
eliminating, in the signals received by the radar detector, pulses belonging to the elimination range;
wherein the signals received by the radar detector comprise a first component, clutter, that is reflected by the land surface and a second component, the external echo component, that is reflected on external isolated objects.

2. The method according to claim 1, wherein during each calculation subphase, the number of characteristics is less than 5.

3. The method according to claim 1, wherein the characteristics include a pulse width and a direction of arrival.

4. The method according to claim 1, wherein each calculating subphase includes a grouping of classes by using a distance criterion between two classes.

5. The method according to claim 1, wherein the radar detector includes an attenuator, the elimination being implemented by using the attenuator preventing the detection of pulses belonging to the elimination range.

6. The method according to claim 1, wherein the radar detector includes a calculator, the elimination being implemented by the calculator by eliminating detected pulses belonging to the elimination range.

7. The method according to claim 1, wherein each onboard transmitter is capable of producing a synchronization signal, the training and elimination phases being paced using the synchronization signal of each onboard transmitter.

8. The method according to claim 1, wherein the acquisition subphase includes formation and use of acquisition ranges.

9. A radar detector comprising an electromagnetic wave receiver and a calculator, the radar detector being configured to carry out a method for testing the electromagnetic compatibility of the radar detector with at least one onboard pulse signal transmitter, the radar detector and each onboard transmitter belonging to the same platform, by eliminating an external echo component in signals received by the radar detector, the method comprising:

a training phase including, for each onboard transmitter:
an acquisition subphase seeking to obtain detected pulses, each pulse being characterized by characteristics, the characteristics including at least a date of arrival of the pulse and a carrier frequency of the pulse, the subphase including:
acquiring signals derived from pulses emitted by the onboard transmitter and each corresponding to the external echo component, to obtain the detected pulses, and
acquiring characteristic measurements of the detected pulses,
a computing subphase including:
distributing the detected pulses into classes grouping together the pulses for which at least two characteristics have a shared value range, and
selecting classes including a number of pulses greater than or equal to a predetermined threshold, to obtain selected classes, and
an elimination phase including:
building an elimination range, the elimination range being a set of pulses detectable by the radar detector belonging to the selected classes, and
eliminating, in the signals received by the radar detector, pulses belonging to the elimination range;
wherein the signals received by the radar detector comprise a first component, clutter, reflected by the land surface and a second component, the external echo component, reflected on external isolated objects.

10. A platform equipped with the radar detector according to claim 9.

* * * * *